(12) United States Patent
Moreux et al.

(10) Patent No.: US 9,267,970 B2
(45) Date of Patent: Feb. 23, 2016

(54) DEVICE FOR MEASURING AN ELECTRIC CURRENT IN A CABLE

(75) Inventors: Alain Moreux, Dijon (FR); Pascal Houbre, Jarrie (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 537 days.

(21) Appl. No.: 13/437,432

(22) Filed: Apr. 2, 2012

(65) Prior Publication Data

US 2012/0256617 A1 Oct. 11, 2012

(30) Foreign Application Priority Data

Apr. 11, 2011 (FR) ...................................... 11 01104

(51) Int. Cl.
*G01R 1/20* (2006.01)
*G01R 15/18* (2006.01)
*G01R 1/22* (2006.01)

(52) U.S. Cl.
CPC ................ *G01R 15/181* (2013.01); *G01R 1/22* (2013.01); *G01R 15/186* (2013.01)

(58) Field of Classification Search
CPC .. G06Q 50/06; G01R 19/2513; G01R 15/181; G01R 15/142; G01R 15/186; G01R 15/12; G01R 15/125; G01R 19/00; G01R 27/16; G01R 31/08; G01R 19/0092; G01R 15/202; G01R 15/205; G01R 15/247; G01R 15/18; G01R 15/183; G01R 1/20; G01K 1/024; H02J 13/0075; G08C 17/02; H04L 12/2825; H01F 17/0033; H01F 27/40; H01F 17/0013; H01F 27/2804; H01F 27/2823; H01F 27/306; Y10T 29/49071
See application file for complete search history.

(56) References Cited

U.S. PATENT DOCUMENTS

| 3,343,052 | A | | 9/1967 | Youngstrom | |
| 4,048,605 | A | | 9/1977 | McCollum | |
| 4,100,488 | A | * | 7/1978 | Quietzsch et al. | ............. 324/127 |
| 4,384,289 | A | * | 5/1983 | Stillwell et al. | .......... 340/870.17 |
| 4,794,327 | A | * | 12/1988 | Fernandes | ...................... 324/126 |
| 6,975,104 | B2 | * | 12/2005 | Gregorec, Jr. | ................. 324/126 |
| 7,253,603 | B2 | | 8/2007 | Kovanko et al. | |
| 2011/0012587 | A1 | * | 1/2011 | Greenberg | ..................... 324/114 |

FOREIGN PATENT DOCUMENTS

| DE | 90 14 565 U1 | 2/1991 |
| EP | 0 999 565 A1 | 5/2000 |
| FR | 2 717 582 A1 | 9/1995 |
| JP | 11-295349 | 10/1999 |
| WO | WO 2009/139521 A1 | 11/2009 |

* cited by examiner

*Primary Examiner* — Vinh Nguyen
(74) *Attorney, Agent, or Firm* — Steptoe & Johnson LLP (57) ABSTRACT

A device for measuring an electric current flowing in a cable, including a flexible Rogowski coil, secured to actuating means for moving the coil to an open position for engagement around a cable, and a closed position to surround the cable, a magnetic circuit, with a winding around the magnetic circuit, for closing around the cable when the coil is in the closed position. The coil in the closed position, may have a non-wound area of predefined length with an overwinding at each opening end of the coil.

21 Claims, 6 Drawing Sheets

DEVICE FOR MEASURING AN ELECTRIC CURRENT IN A CABLE

BACKGROUND OF THE INVENTION

The invention relates to the field of measurement of an electric current flowing in a cable.

The object of the invention is more particularly to provide a device for measuring an electric current flowing in a cable, comprising means for securing a flexible Rogowski core able to occupy an open position enabling engagement around the cable and a closed position designed to surround the cable.

It also relates to an assembly for measuring this current comprising at least one measuring device, and to a device for measuring power and energy comprising at least one such measurement sensor.

STATE OF THE ART

Numerous measurement sensors for measuring an electric current flowing in a cable exist that can be fitted around the cable without having to interrupt electric power distribution or to perform any operation on the electric installation. Such sensors act as current transformer using the magnetic field generated by flow of the current in the cable. More precisely, the cable in practice constitutes the primary of the transformer, although it is not equipped with a primary winding proper: the spiral of the primary is constituted by passage of the cable in which the current to be measured in the transformer secondary flows.

The transformer secondary for its part can be formed in several manners. A first solution consists in arranging a magnetic circuit threaded onto the cable and a coil of several turns is wound around the magnetic circuit. The magnetic circuit can be made in a single part but it is then necessary to disconnect the cable to engage the transformer secondary on the cable which then has to be connected again. These tasks are fastidious and not very secure.

Another construction, as described in the document U.S. Pat. No. 4,048,605, consists in providing a magnetic circuit in two rigid parts articulated so as to move away from one another when the cable is fitted inside the magnetic circuit and to then reclose against one another so that, in the working position, the magnetic circuit is well closed. Such an arrangement is commonly used in the field of hook-on ammeters.

Arrangements of this type do however present the major shortcoming that opening of the magnetic circuit in two rigid parts requires mechanical means which are complex and two opening areas which have a larger sensitivity to the magnetic field of external or internal origin and therefore make measurement of the primary current false. Furthermore, the rigidity and dimensions of the assembly prevent certain accessibilities to the measurements. The weight of the arrangement also constitutes a drawback for magnetic circuits of larger diameter, in particular according to the diameter of the cable.

A second solution to form the secondary of the current transformer formed by a measuring component forming part of the measurement sensor consists in using a Rogowski core. In known manner, the latter is composed of a spiral wire winding one end of which returns via the centre of the winding to the other end so that the two terminals are situated at the same end of the winding. The coil formed in this way is positioned around the cable. The voltage induced in the winding is for example proportional to the rate of change (derivative) of the current in the cable. The Rogowski core is usually connected to an electric (or electronic) integration circuit with high input impedance in order to supply an output signal that is proportional to the current.

The document U.S. Pat. No. 7,253,603 describes a solution implementing a Rogowski coil of rigid type. The coil constantly adopts a shape that is not flat but is helical in the direction of the cable, so that the two ends of the coil do not coincide and are on the contrary offset to delineate a sufficient space to enable engagement of the cable in this helical coil.

The documents EP-A1-0999565 and U.S. Pat. No. 3,343,052 for their part describe solutions able to use a flexible and opening Rogowski coil, liable to vary, by deformation of the coil, between a closed position surrounding the cable in which the current to be measured flows and an open position enabling engagement of the cable inside the coil. Securing of the coil in the closed position is performed by a closing mechanism for example by high-speed clip-fastening such as a male/female type engagement. However the presence of such a closing mechanism requires a manual action directly on the coil at the level of its free ends to secure or release the closing mechanism in order to be able to manually deform the coil, by manual manipulation of at least one of the free ends, between its closed and open positions. These manual actions on the closing mechanism and the manual manipulations of said at least one free end of the coil are delicate, fastidious, and not practical to accomplish concretely, in particular in case of limited accessibility to the measurements.

OBJECT OF THE INVENTION

The object of the present invention is to remedy these shortcomings by proposing a device for measuring an electric current flowing in a cable that makes measurement easier to perform.

According to the invention, in a device for measuring an electric current flowing in a cable comprising means for securing a flexible Rogowski coil able to occupy an open position enabling engagement around the cable and a closed position designed to surround the cable, the device comprises actuating means designed to make said coil move from one position to the other.

Advantageously, the actuating means comprise two articulated jaws to which the coil is secured and able to occupy a separated position and a touching position placing the coil respectively in its open and closed positions.

The coil is preferably fitted on a support securedly attached to the jaws. The support is preferably formed by a flexible trunking secured to the jaws.

A return spring advantageously biases the jaws to their touching position to ensure at least partially automatic closing of the coil.

The jaws are preferably equipped with spacer elements configured in such a way as to transform a force applied by the cable on said spacer elements, in the direction of the inside of the coil when engagement of the cable takes place, into a separating movement of the jaws. The spacer elements preferably each comprise a ramp inclined with respect to the expected direction of engagement movement of the cable towards the inside of the coil.

In a particular embodiment, the device comprises a magnetic circuit closing around the cable when the actuating means command the closed position of the coil, and a coiling around the magnetic circuit, to supply measurement and/or transmission electronics of the result of the measurements.

At least one of the jaws preferably supports at least a part of the magnetic circuit and of the coiling, said magnetic circuit being closed when the securing means are in the closed position.

In a preferred embodiment, the device comprises centring means to centre the securing means and said coil around an electric cable, said centring means being in the form of flexible rods.

The coiling is preferably formed on a structure enabling linear winding.

The jaws are preferably each fitted pivoting on an armature able to be joined to an operating rod, movement of which rod in translation with respect to the armature commands the pivoting movement of each of the jaws with respect to the armature.

Preferably, when the coil is in the closed position, there is a non-wound area of predefined distance and an overwinding at each opening end of said coil.

A measurement assembly according to the invention comprises at least one measuring device as defined above. Advantageously, the assembly comprises measurement and/or transmission electronics of the result of the measurements receiving data from the coil of the measuring device.

The invention also relates to a measurement sensor comprising at least one measuring device of this type, and a power and energy measuring device comprising at least one sensor as described above.

BRIEF DESCRIPTION OF THE DRAWINGS

Other advantages and features will become more clearly apparent from the following description of particular embodiments of the invention given for non-restrictive example purposes only and represented in the appended figures, in which.

DESCRIPTION OF PREFERRED EMBODIMENTS OF THE INVENTION

Figure 9:
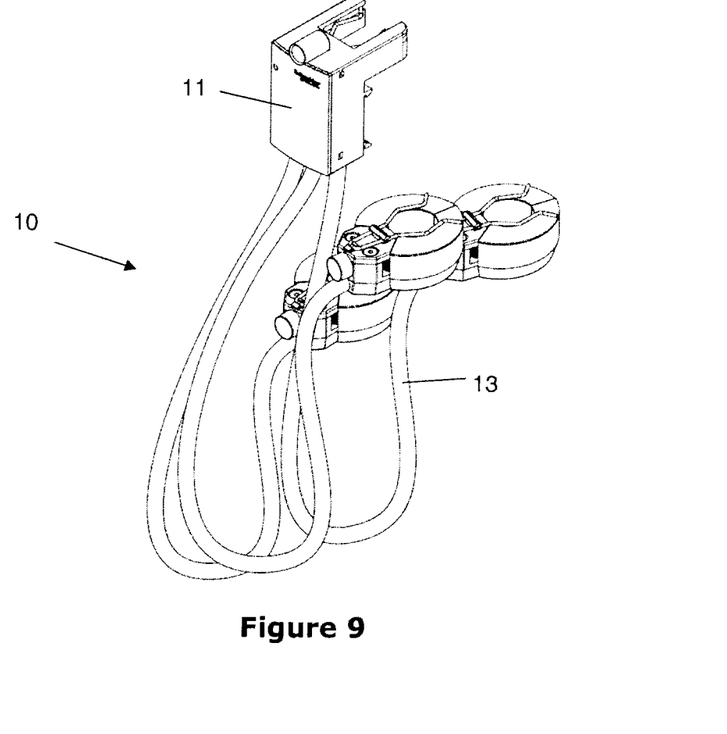
FIG. 9 illustrates a possible complete arrangement of a sensor according to the first and second embodiments.

With reference to FIG. 9, a possible complete arrangement of a measurement sensor 10 according to the invention comprises a case 11 in which measurement and/or transmission electronics of the result of the measurements are housed. The electronics receive data from at least one appropriate measuring device 12 (three in number in the example of FIG. 9) via at least one connection 13, this data being in relation with the value of the electric current to be measured.

Figure 1:
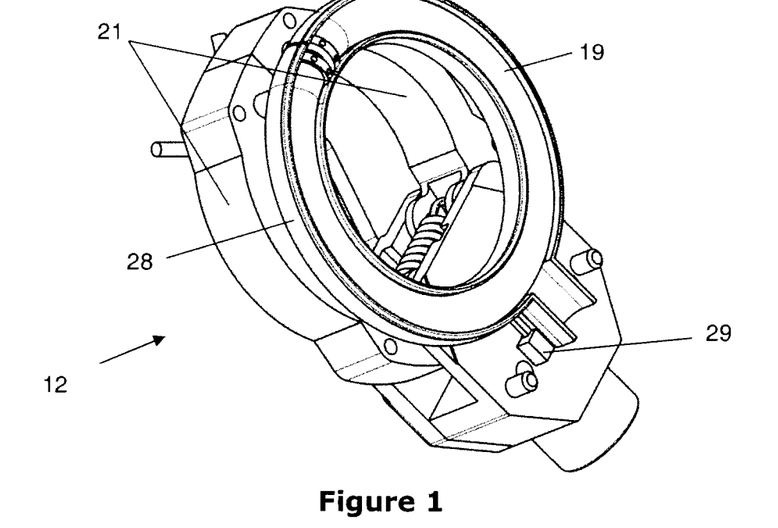
FIG. 1 is a front perspective view of a measuring device of a first embodiment of a measurement sensor according to the invention.
Figure 2:
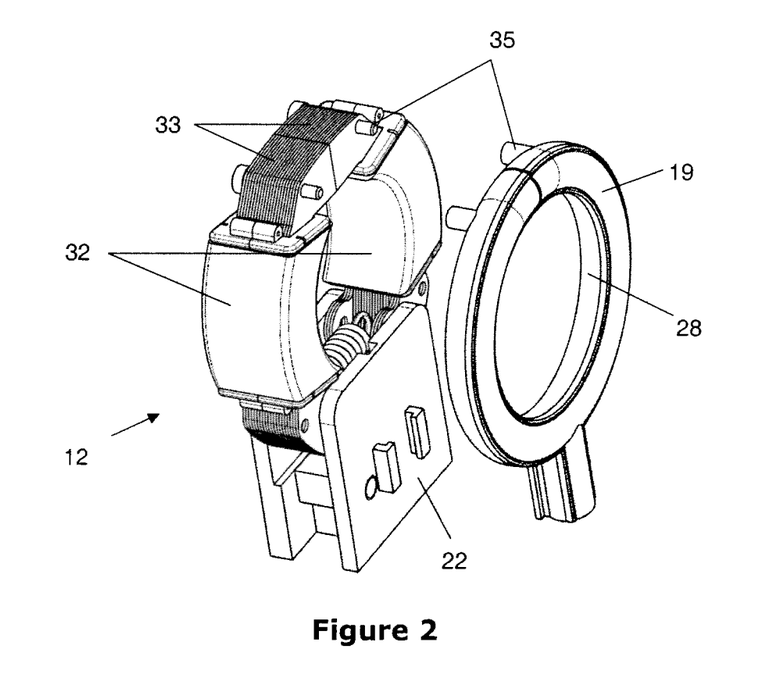
FIG. 2 is a front perspective view of a measuring device of a second embodiment of a measurement sensor according to the invention, the Rogowski coil being detached.

FIGS. 1 and 2 illustrate such a measuring device 12 used in arrangement of a measurement sensor 10 respectively according to first and second embodiments. In the second embodiment represented in FIG. 2, the measuring device 12 performs electric power supply of the measurement and/or transmission electronics of the result of the measurements, which is not the case of the measuring device 12 according to the first embodiment represented in FIG. 1. The measuring device 12 visible in FIG. 1 in fact has the sole vocation of transmitting to these electronics only the data in relation with the value of the electric current to be measured by the device 12 concerned.

Figure 10:
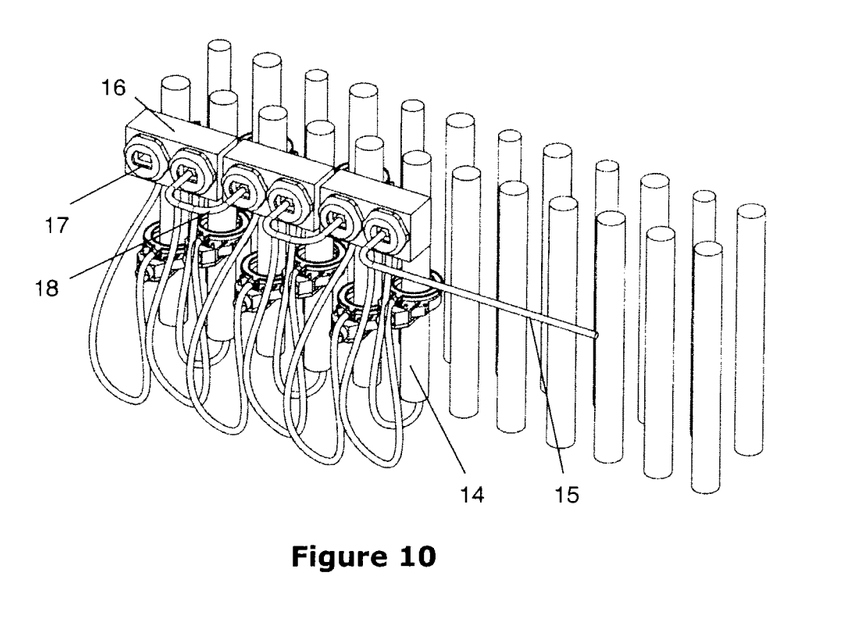
FIG. 10 represents a possible assembly of the arrangement of FIG. 9 on an electric installation having several cables in which an electric current flows.

With reference to FIG. 10, the arrangement of FIG. 9 is designed to be fitted on an electric installation having several cables 14 in which an electric current to be measured flows. In FIG. 10, three measurement sensors 10 according to the first embodiment are fitted on the installation in such a way that each of the three measuring devices 12 of the three sensors 10 is associated with one of the cables 14 of the installation in order to individually measure the value of the electric current flowing in the cable 14 associated with the corresponding measuring device 12. In FIG. 10, the measurement and/or transmission electronics of the result of the measurements of each of the sensors 10 receives an external electric power supply by means of a main communication bus 15 connected to a data concentration enclosure 16 each housing the electronics of the sensor 10 and provided with at least one connector 17 for connection with the main bus 15 or the intersensor bus 18 performing communication and power supply between the sensors 10. In the case where the measurement sensors 10 used in FIG. 10 correspond to a second embodiment, the elements 15 to 18 can advantageously be eliminated.

A measuring device 12 according to one feature of the invention designed to perform measurement of an electric current flowing in at least one cable 14 comprises a Rogowski coil 19 at the level of each of its measuring devices 12, as illustrated in FIGS. 1 and 2 in particular. The device 12 thus comprises at least one flexible Rogowski coil 19 able to occupy an open position enabling engagement around the cable 14 and a closed position designed to surround the cable 14. Engagement of the coil 19 around the cable 14 corresponds to fitting of the measuring device 12 of the measurement sensor 10 and results in engagement of the cable 14 inside the coil 19. The latter is composed of a winding, for example a helical winding, of one or more wires wound on one or more layers on a flexible tube curved into the general shape of a coil. Winding of the wire(s) is performed in such a way that the two terminals of the coiling are situated at one of the two free ends of the coil 19 which is able to open at the level of a discontinuity of the tube forming the two ends. Concretely, the free ends of the coil 19 are for example in contact in the closed position of the coil 19 and are separated from one another in the open position of the coil 19 by a sufficient distance to the cable 14 enter into the coil 19. In the closed position, the coil thus formed by winding of the wire(s) is positioned around the cable 14. Over-winding of turns can be provided at each free end of the coil 19 to compensate the air-gap present in the closed position. This air-gap is advantageously kept constant in the closed position due to the actuating means described above.

Figure 5:
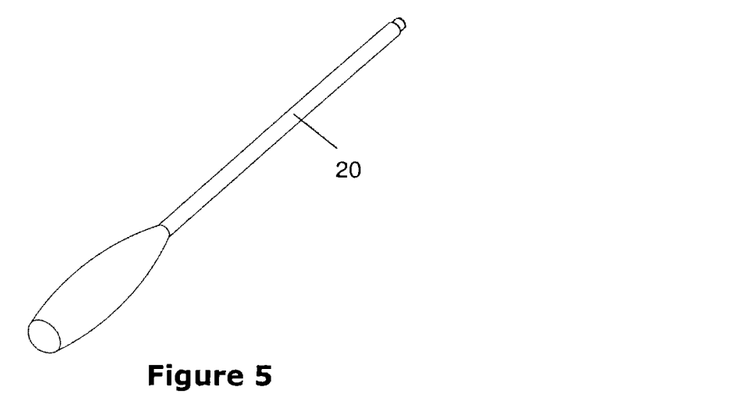
FIG. 5 illustrates an example of an operating rod.

Indeed according to an essential feature, the measuring device 12 (whether it be according to the first embodiment of FIG. 1 or according to the second embodiment of FIG. 2) comprises actuating means, for example of mechanical type, configured so as to be able to move the coil 19 from one position to the other without the user of the sensor 10 having to grasp and manipulate the coil 19 with his hands. On the contrary, the actuating means can advantageously be remote-controlled by means of an operating rod 20, for example visible in FIG. 5.

Figure 6:
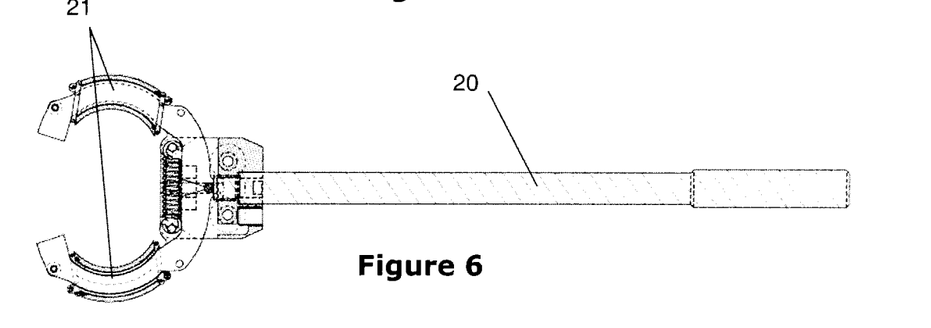
FIG. 6 represents a front view of the device of FIG. 2 in a configuration commanding the open position of the coil.

The actuating means can comprise two articulated jaws 21, of curved shape, to which the coil 19 is secured and that are able to occupy either a separated or a touching position placing the coil 19 respectively in its open and closed positions. The jaws 21 are arranged in a parallel plane to the plane of the coil 19. The plane of movement of the jaws 21 when they vary between the separated and the touching position is offset with respect to the deformation plane of the coil 19 between its open and closed positions in a direction perpendicular to these planes. The curvature of the jaws 21 is included in the plane of movement of the jaws and configured in such a way that the concave surfaces of the jaws 21 are facing one another in this plane. FIG. 6 illustrates the measuring device 12 of FIG. 2 in the case where the jaws 21 adopt their separated position. A particular shape of the jaws 21, for example oval, can be optimized so as to be able to maximize the distance separating the free ends of the jaws 21 in the separated position while at the same time reducing the general space occupation of the jaws 21. In the touching position of the jaws 21, the free ends of the latter for example come into contact with one another.

Figure 4:
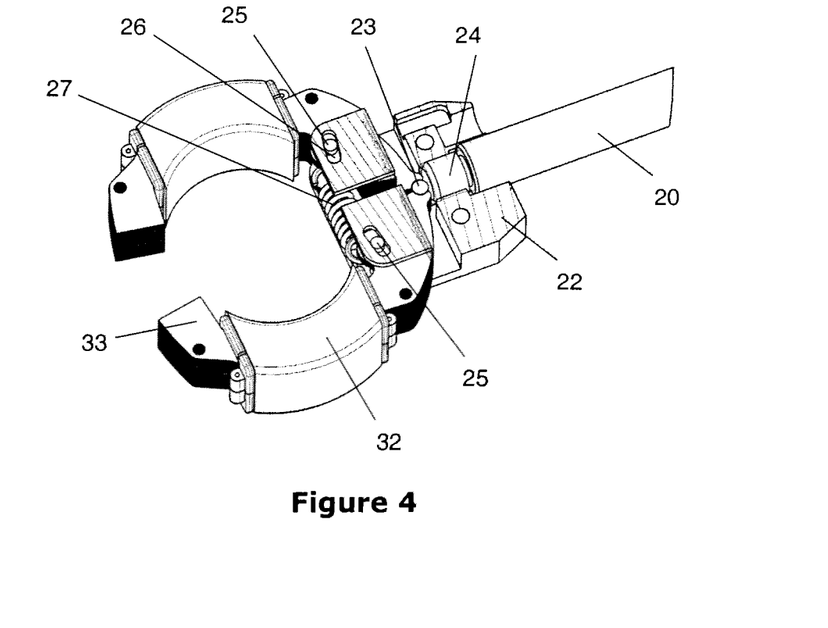
FIG. 4 represents the device of FIG. 2 in an at least partially open configuration of the Rogowski coil after handling of an operating rod.

For the example purposes visible in detail in FIG. 4, the jaws 21 are each fitted pivoting on an armature 22 able to be joined to the operating rod 20 movement of which in translation with respect to the armature 22 commands the pivoting movement of each of the jaws 21 with respect to the armature 22. The pivoting axis 23 of the jaws 21 on the armature 22 is common for the two jaws 21. For precise control of the angular movement of the jaws 21, the head 24 of the operating rod 20 is for example fitted on the armature 22 by a helical link transforming a rotational movement by screwing imposed by the user on the operating rod 20 on its end opposite the head 24 into a translational movement of the head 24. Screwing and unscrewing of the rod 20 for example command movement of the jaws 21 respectively to their separated and touching positions. In its translation movement, the head 24 moves with it in an identical movement of the pivoting axis 23. To transform the straight translational movement of the pivoting axis 23 into a pivoting movement of the jaws 21, the latter are each equipped with a pin 25 fitted sliding in an associated aperture 26 arranged in the armature 22. The two apertures 26 extend substantially perpendicularly with respect to the direction of translation of the pivoting axis 23. The pins 25 are joined to one another by a spring 27 tending to bias them towards one another.

A possible assembly of the coil 19 on the jaws 21 consist in fitting the coil 19 on a support 28 able to be secured to the jaws 21. The support 28 is for example formed by a flexible trunking secured to the jaws 21 by fixing means enabling it to take a shape corresponding to the expected shape of the coil 19 of which it forms the housing. Such fixing means can consist of high-speed clipping-fastening 35 (for example by engagement of male/female type) provided on each of the free ends of the trunking for securing to a corresponding jaw 21. As a complement, it is possible to secure the trunking substantially in the middle of its length on the armature at the level of a slide 29.

Figure 3:
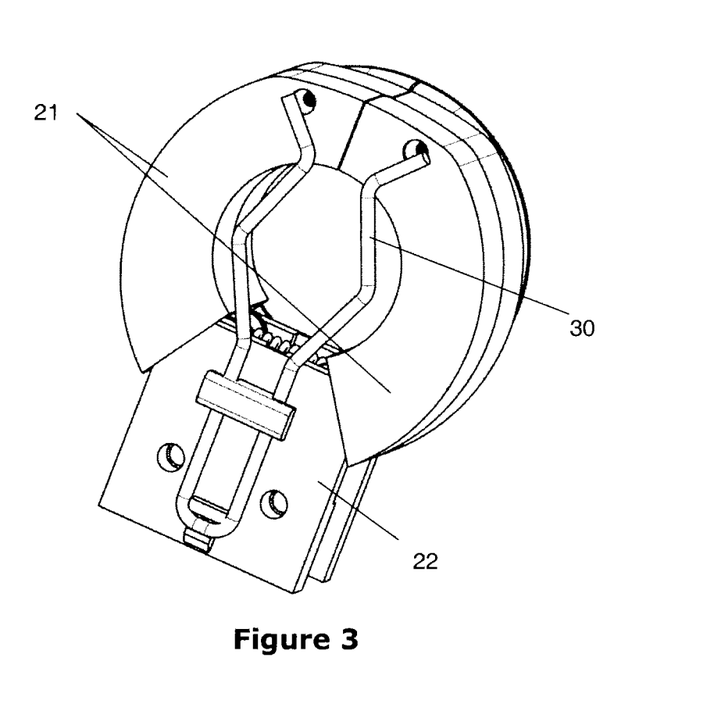
FIG. 3 illustrates a rear perspective view of the device of FIG. 1.

As shown in FIG. 3, a return spring 27 biases the jaws 21 to their touching position to ensure at least partially automatic closing of the coil 19 to its closed position, as a complement to any action made by the user on the operating rod 20. FIG. 3 also shows a centring spring 30 comprising flexible rods. The spring 30 is achieved in the form of a grip or a lyre enabling the sensor to be held in position on the cable and to be centred in the centre of the coil and/or of the magnetic circuit. The form of this spring 30 enables it to adapt automatically to different cable diameters, for example between 15 and 29 mm.

Figure 7:
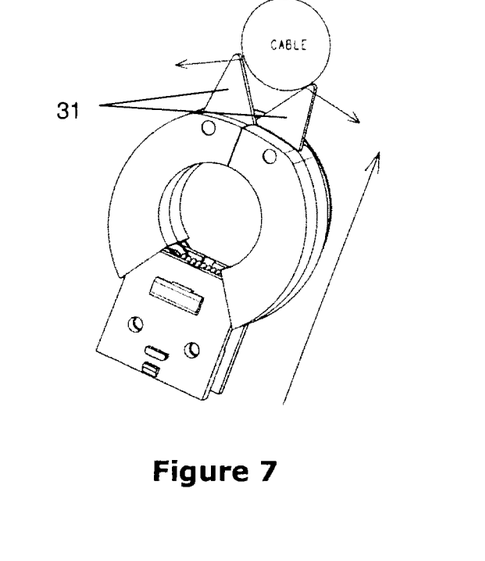
FIG. 7 represents a perspective view of an alternative embodiment of the device of FIG. 1 in the closed position of the coil, prior to engagement of a cable inside the coil.

In the non-restrictive alternative embodiment represented in FIG. 7, each of the jaws 21 is equipped with a separating element 31 for example in the form of a lug arranged in the extension of the body of the jaw 21. The pair of separating elements 31 are arranged in a V-shape to transform a wedging force applied by the cable 14 on said separating elements 31, in the direction of the inside of the coil 19 when engagement of the cable 14 takes place, into a separating movement of the jaws 21. For example, the separating elements 31 each comprise a ramp inclined with respect to the expected direction of engagement movement of the cable 14 towards the inside of the coil 19.

In the embodiment of FIG. 2, unlike that of FIG. 1, the measuring device 12 of the sensor comprises a magnetic circuit closing around the cable 14 when the actuating means command the closed position of the coil 19, and also a coiling around the magnetic circuit, to supply the measurement and/or transmission electronics of the result of the measurements which equips the sensor. For this purpose, with reference to FIG. 2, at least one of the jaws 21 can support at least a part of the magnetic circuit and of the winding 32. The magnetic circuit can be achieved by an assembly formed by stacking of sheet metal plates 33. For example, a stacking of metal plates 33 can constitute the body of each of the jaws 21 whereas the two windings 32 can be arranged so as to each surround one of the stacking of metal plates 33 over at least a part of its length. In the touching position of the jaws 21, the free ends of the latter come into contact with one another to guarantee closing of the magnetic circuit and, as set out in the foregoing, to guarantee a constant air-gap. The same result is obtained at the level of their ends articulated at the level of the pivoting axis 23 due to the advantageous presence of the spring 27. Furthermore, it is possible to provide for the cross-section of the metal plates to be increased by moving their ends towards one another in order to reduce the air-gap.

Figure 11:
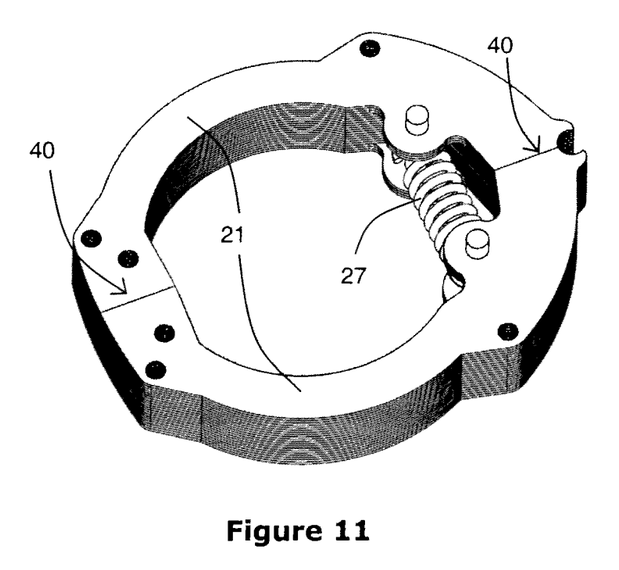
FIG. 11 represents a closed position of the jaws.

FIG. 11 represents a closed position of the jaws formed by stacks of metal plates 33 forming a magnetic circuit. Ends 40 of each jaw or part of the magnetic circuit are kept clamped to one another by the spring 27.

Figure 8:
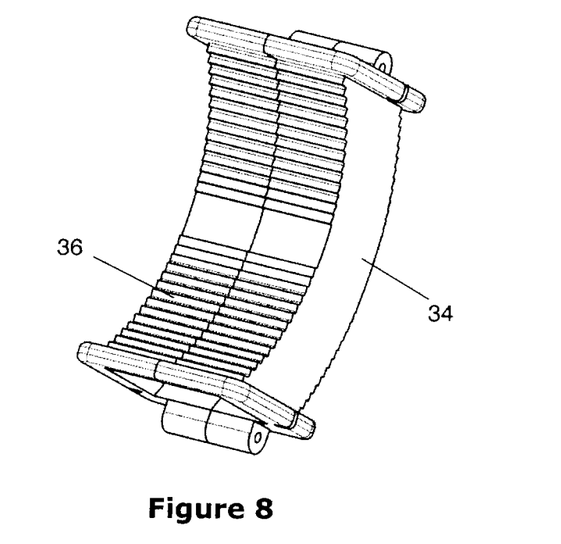
FIG. 8 is a perspective view of a structure for a winding used in the second embodiment.

With reference to FIG. 8, each of the windings 32 can be formed on a structure 34 for example in the form of a curved sleeve provided with notches 36 for securing the winding wire 32 arranged to enable or facilitate coiling on a linear coil winding machine.

Figure 12:
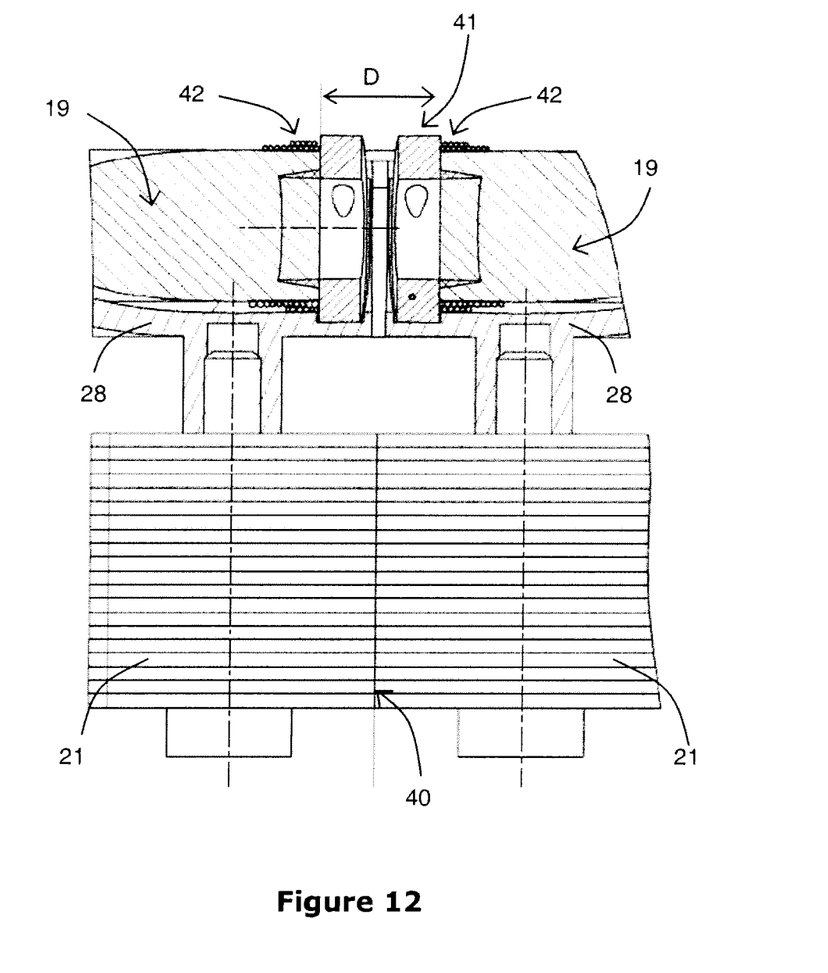
FIG. 12 shows a detailed view of the opening area of the sensor in its closed position.

FIG. 12 shows a detailed view of the opening area of the sensor in its closed position. When the coil is in the closed position, there is a non-wound area 41 of predefined distance (D) and an overwinding 42 at each opening end of said coil (19).

The operating rod 20 can be considered to belong to the above-mentioned actuating means which equip the sensor 10 at the level of each of its measuring devices 12 in the case where the operating rod 20 is permanently secured to the armature. However the operating rod 20 may not belong directly to the sensor 10 as such when a removable assembly is provided between the armature 22 of the sensor 10 and the operating rod 20. In the latter case, by remote manual action with respect to the sensor 10, the operating rod 20 enables the user of the sensor 10 to remote-control the actuating means which equip the sensor at the level of each of its measuring devices 12.

The invention is not limited to the kinematics of the actuating means which have just been described in detail for exclusively illustrative purposes only, and the person skilled in the trade will be able to envisage any suitable equivalent solution to achieve the required result, for example implementing transmission using connecting rods.

Finally, a lighting system may be fitted in the axis of the operating rod 20 to enable the cable 14 to be lit when assembly and disassembly of the measuring devices 12 of the sensor 10 on the cables 14 are performed. The thickness of the assembly formed by the coil 19 and jaws 21 can advantageously be smaller than 30 mm in order to facilitate handling of the measuring device 12 between the cables 14. This feature does in fact enable the measuring devices 12 to be easily inserted among the cables 14 by pivoting them through 90 degrees (so as to place them in parallel manner to the cables) with respect to the measuring configuration.

In the first embodiment devoid of a magnetic circuit and of sensor electronics supply windings 32, the stacks of metal sheets 33 and the windings 32 can be replaced by two monoblock parts, for example formed from a plastic material.

It can be understood from the foregoing that the measuring devices and in general manner the measurement sensor which have just been described can be fitted on an installation without requiring any interruption of the electric power distribution and without placing the user in a risk situation. They present the additional advantage of ease of fitting on the cables of the installation in particular when numerous rigid cables are located close to one another. Finally they enable precision measurement of the electric current flowing in at least one cable while at the same time being able, in the second embodiment, to ensure electric power supply of the sensor electronics.

Finally, in the case where complementary data such as for example the phase voltage can be transmitted from the outside to the electronics of the sensor 10, it is possible to perform computation of the power and of the energy flowing in the cable 14. A power and energy measuring device can thus be obtained from use of at least one measuring sensor as described in the foregoing.

The invention claimed is:

1. A device for measuring an electric current flowing in a cable, comprising,
    means for securing a flexible Rogowski coil, to occupy an open position enabling engagement around a cable, and a closed position to surround the cable,
    actuating means for moving said coil from one of said positions to the other,
    a magnetic circuit for closing around the cable when the actuating means have the coil in the closed position of the coil,
    and a winding around the magnetic circuit.

2. The device according to claim 1, wherein the actuating means comprise two articulated jaws to which the coil is secured and for causing the coil to occupy open and closed positions, respectively.

3. The device according to claim 2, wherein the coil is fitted on a support securedly attached to the jaws.

4. The device according to claim 3, wherein the support is formed by a flexible trunking secured to the jaws.

5. The device according to claim 2, wherein a return spring biases the jaws to the closed position to ensure at least partially automatic closing of the coil.

6. The device according to claim 2, wherein the jaws include separating elements for transmitting a force applied by the cable on said separating elements, in the direction of the inside of the coil to cause a separating movement of the jaws.

7. The device according to claim 2, wherein the spacer elements each comprise an inclined ramp, together forming a V-shape with respect to a direction of engagement movement of the cable towards the inside of the coil.

8. The device according to claim 2, wherein at least one of the jaws supports at least a part of the magnetic circuit and of the coiling, so that said magnetic circuit is closed when the coil is in the closed position.

9. The device according to claim 2, wherein at least one of the jaws supports at least a part of the magnetic circuit and of the coiling, so that said magnetic circuit is closed when the coil is in the closed position.

10. The device according to claim 1, additionally comprising centering means for centering the securing means and said coil around an electric cable, said centring means being in the form of flexible rods.

11. The device according to claim 1, wherein the winding is wound around a structure facilitating linear coil winding.

12. The device according to claim 1, wherein the jaws are each pivotally fitted on an armature able to be joined to an operating rod, so that movement of such a rod in translation with respect to the armature will cause pivoting movement of each of the jaws with respect to the armature.

13. A device for measuring an electric current flowing in a cable, comprising:
    a ring-shaped, flexible Rogowski coil (19) comprising: a helical wire winding, and having two opening ends opposing each other at a discontinuity in the coil, said opening ends contacting each other in a closed position and separable from each other into an open position enabling placement of the coil around a cable, each opening end comprising a length of the coil in which the winding is overwound (42) and an adjacent non-wound length (41) of the coil, the non-wound lengths of said opening ends being contiguous each other in the closed position thereby forming a non-wound area (D);
    actuating means for moving said coil to and from the opening position enabling placement around the cable, and the closed position;
    and means for securing the Rogowski coil to the actuating means.

14. The device according to claim 13, wherein the actuating means comprise two articulated jaws to which the coil is secured and for causing the coil to occupy open and closed positions, respectively.

15. The device according to claim 14, wherein the coil is fitted on a support securedly attached to the jaws.

16. The device according to claim 15, wherein the support is formed by a flexible trunking secured to the jaws.

17. The device according to claim 14, wherein a return spring biases the jaws to the closed position to ensure at least partially automatic closing of the coil.

18. The device according to claim 14, wherein the jaws include separating elements for transmitting a force applied by the cable on said separating elements, in the direction of the inside of the coil to cause a separating movement of the jaws.

19. The device according to claim 18, wherein the separating elements each comprise an inclined ramp, together forming a V-shape with respect to a direction of engagement movement of the cable towards the inside of the coil.

20. The device according to claim 14, wherein the jaws are each pivotally fitted on an armature able to be joined to an operating rod, so that movement of such a rod in translation with respect to the armature will cause pivoting movement of each of the jaws with respect to the armature.

21. The device according to claim 13, additionally comprising centering means for centering the securing means and said coil around an electric cable, said centering means being in the form of flexible rods.

* * * * *